(12) United States Patent
Aleksov et al.

(10) Patent No.: US 10,741,534 B2
(45) Date of Patent: Aug. 11, 2020

(54) MULTI-DIE MICROELECTRONIC DEVICE WITH INTEGRAL HEAT SPREADER

(71) Applicant: Intel Corporation, Santa Clara, CA (US)

(72) Inventors: Aleksandar Aleksov, Chandler, AZ (US); Sri Ranga Sai Boyapati, Chandler, AZ (US); Kristof Darmawikarta, Chandler, AZ (US); Rahul N. Manepalli, Chandler, AZ (US); Robert Alan May, Chandler, AZ (US); Srinivas V. Pietambaram, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/145,620

(22) Filed: Sep. 28, 2018

(65) Prior Publication Data

US 2020/0105731 A1 Apr. 2, 2020

(51) Int. Cl.
*H01L 25/18* (2006.01)
*H01L 23/00* (2006.01)
*H01L 23/538* (2006.01)
*H01L 23/373* (2006.01)

(52) U.S. Cl.
CPC .......... *H01L 25/18* (2013.01); *H01L 23/3736* (2013.01); *H01L 23/5383* (2013.01); *H01L 24/33* (2013.01); *H01L 24/83* (2013.01); *H01L 2224/0231* (2013.01); *H01L 2224/02331* (2013.01)

(58) Field of Classification Search
CPC . H01L 25/18; H01L 23/3736; H01L 23/5383; H01L 24/33; H01L 24/83
See application file for complete search history.

(56) References Cited

U.S. PATENT DOCUMENTS

| | | | | |
|---|---|---|---|---|
| 6,639,324 B1* | 10/2003 | Chien | ................. | H01L 23/3121 257/700 |
| 6,919,508 B2* | 7/2005 | Forcier | ................. | B81C 1/0023 174/565 |
| 7,241,678 B2* | 7/2007 | Ho | .......................... | H01L 24/11 257/779 |
| 7,417,299 B2* | 8/2008 | Hu | .......................... | H01L 23/36 257/528 |
| 2003/0148554 A1* | 8/2003 | Gerber | ................ | H01L 23/4334 438/122 |
| 2007/0158861 A1* | 7/2007 | Huang | ................ | H01L 23/5389 257/787 |

(Continued)

FOREIGN PATENT DOCUMENTS

WO    WO-2017111789 A1    6/2017

*Primary Examiner* — Peniel M Gumedzoe
(74) *Attorney, Agent, or Firm* — Schwegman Lundberg & Woessner, P.A.

(57) ABSTRACT

The present description addresses example methods for forming multi-chip microelectronic devices and the resulting devices. The multiple semiconductor die of the multichip package will be attached to a solid plate with a bonding system selected to withstand stresses applied when a mold material is applied to encapsulate the die of the multichip device. The solid plate will remain as a portion of the finished multi-chip device. The solid plate can be a metal plate to function as a heat spreader for the completed multi-chip device.

20 Claims, 7 Drawing Sheets

(56) References Cited

U.S. PATENT DOCUMENTS

| | | | |
|---|---|---|---|
| 2010/0013087 A1* | 1/2010 | England | H01L 23/5389 |
| | | | 257/700 |
| 2010/0213599 A1* | 8/2010 | Watanabe | H01L 23/13 |
| | | | 257/693 |
| 2014/0077394 A1 | 3/2014 | Chang et al. | |
| 2014/0203429 A1* | 7/2014 | Yu | H01L 21/78 |
| | | | 257/737 |
| 2014/0357020 A1 | 12/2014 | Aleksov et al. | |
| 2015/0262972 A1* | 9/2015 | Katkar | H01L 21/561 |
| | | | 257/48 |
| 2016/0049383 A1 | 2/2016 | Woychik et al. | |
| 2018/0090467 A1 | 3/2018 | Kim et al. | |

* cited by examiner

US 10,741,534 B2

MULTI-DIE MICROELECTRONIC DEVICE WITH INTEGRAL HEAT SPREADER

TECHNICAL FIELD

Embodiments described herein relate generally to multi-die microelectronic devices and methods of their formation, and more particularly relate to multi-die packaging incorporating a molded component and an integral heat spreader to form a microelectronic device, and further methods of manufacture of such microelectronic devices.

BACKGROUND

Many forms of microelectronic devices such as IC (integrated circuit) packages include multiple semiconductor die (also, referred to herein as "die") (such a package also known as a "Multi-Chip Package" or "MCP"). In some examples, the multiple die are coupled to a redistribution structure (termed in the art a "redistribution layer" or "RDL") configured to establish interconnections between two or more of the multiple die within the MCP, and also to facilitate electrical and mechanical attachment to other devices (for example, a printed circuit board, such as a motherboard, or another modular assembly). Such an RDL may include one or more dielectric build-up layers, each build-up layer supporting conductive traces and vias to connect, directly or indirectly, with respective contacts on one or more semiconductor die and/or with vias in other layers of the RDL, to redistribute the die contacts to other locations. In the case of the "fan-out" RDLs used in such packages, the RDL may include electrical traces arranged to redistribute at least a portion, or all, of the contacts on a die to contact locations outside the lateral dimensions of the semiconductor die itself (the 'footprint" of the die). Such fan-out RDLs also facilitate interconnections between the multiple die of an MCP.

Forming a MCP incorporating an RDL to interconnect two or more die typically involves placing the individual die on a mold carrier through use of an adhesive to maintain the die in fixed position relative to one another, with the active surfaces of the die contacting the adhesive. A mold compound will then be placed over the multiple die to encapsulate the die, and cured to form a "reconstituted wafer" including all the die. The reconstituted wafer may then be removed from the carrier and inverted to allow forming the desired layers of an RDL coupling to contacts on the active surfaces of the individual die.

A current trend in the industry is the packaging of increasing numbers of die together to provide greater functionality within a smaller form factor; and also while accommodating progressively finer pitches for contacts on the die. As a result, any shifting of the die relative to the mold carrier during the molding process, as can sometimes result with conventional processes, can significantly complicate forming of the layers of the RDL. This variability in the relative placement of the die of a MCP, can complicate the manufacturing process, such as by requiring imaging of the reconstituted wafer at each MCP site, and can also limit the resolution of traces and other conductive structures that can be formed in the RDL.

DESCRIPTION OF EMBODIMENTS

Figure 1:
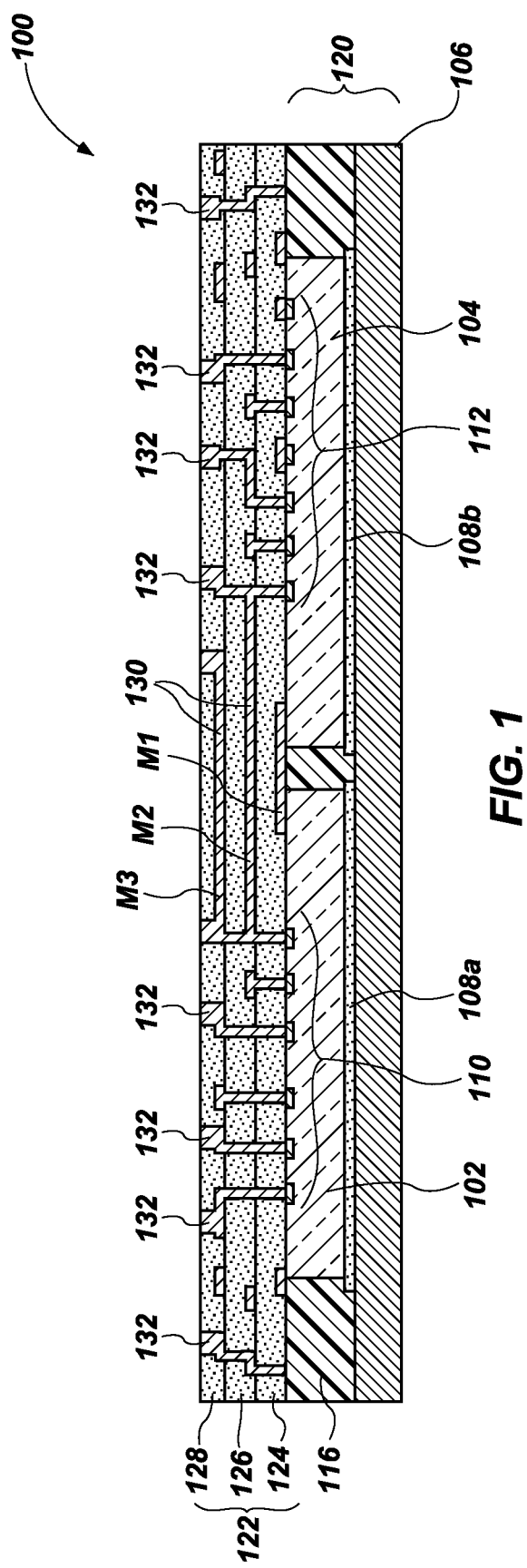
FIG. 1 depicts a simplified cross-sectional representation of an example MCP microelectronic device as described in more detail later herein.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The present description addresses example structures for MCP microelectronic devices. In some examples, these structures may be used to provide improved stability in orientation of the multiple die during the molding process. Additionally, the structures can be implemented to provide a heat spreader for the MCP which is thermally coupled to the die within the package.

For example, rather than placing the die on the surface of a mold carrier, the multiple die of one or more MCPs to be formed will be placed on, and secured to, a solid plate that will form a part of the completed MCP. In some examples, solid plates formed of various materials may be utilized, including, for example, silicon, quartz, carbon (or carbon fiber), or metal. For many examples, the solid plate will be formed of a material of high thermal conductivity to allow the plate to be used as a heat spreader in the completed MCP. One desirable material for the solid plate will be metal, such as, for example, copper or aluminum, though other metals can be utilized. Alternatively, metallic or non-metallic materials can be used for the solid plate, such as, for example, silicon carbide, aluminum nitride, or diamond. For purposes of the present description, the example embodiments will be described as incorporating a metal plate for the solid plate. However, it should be understood that other non-metal materials with similar or greater thermal conductivities to copper or aluminum may be utilized for the solid base plate. Additionally, where the base plate is not needed to further act as a heat spreader, a non-metal material of lower thermal conductivity than copper or aluminum may be substituted for any of the metal base plates described in reference to the figures herein. Though most materials will have some degree of thermal conductivity, the term "thermally conductive base plate" will be used herein to refer to base plates formed of material(s) having a thermal conductivity of 100 Watts/meter times Kelvin ("W/mK") or greater.

In many examples, the metal plate may be planar on both upper and lower parallel surfaces, while in other examples it may have a non-uniform thickness, as will be discussed in more detail later herein. The die for each MCP can either be placed on an individual metal plate (in examples in which a metal plate is utilized), or the die for multiple MCPs can be placed on a single metal plate which can be singulated along with other structures to form individual MCPs. The metal plate(s) will then be secured, for example through an adhesive, to the mold carrier. In some example configurations, in which the metal plate is configured to be of a substantial thickness sufficient to have strength to enable functioning as a mold carrier, the metal plate may potentially be utilized as the mold carrier, eliminating the need for a separate carrier.

Because the multiple die will not be separated from the metal plate on which they are placed, the attachment strength of the bonding of the die can be much greater than is feasible in conventional processes, in which die are adhesively attached to a mold carrier only temporarily (and with the active surfaces adjacent the adhesive), from which they later must be separated. In the examples described herein, the bonding will be through use of either a suitable organic adhesive or a metal alloy (in some examples, metal alloy solder), designed to provide a higher strength attachment that can withstand the shear forces that act upon the die during the mold process. Additionally, use of a bonding system (organic adhesive or metal alloy) with appropriate thermal conductivity facilitates the metal base plate serving as a heat spreader for the completed MCP.

Referring now to FIG. 1, the figure depicts a simplified cross-sectional representation of a portion of an example MCP 100. The representative portion may be part of an embedded wafer level ball grid array ("eWLB"), or part of an embedded panel level ball grid array ("ePLB"). In some examples of forming reconstituted structures for MCPs, use of a panel (rectangular) structure may be preferred over a wafer (round) structure. For purposes of the present description, the term "reconstituted wafer" is used in its broadest conventional usage to generically refer to reconstituted structures of either form of a wafer or a panel configuration.

For purposes of illustrating the current concepts, the depicted portion of MCP 100 depicts only two semiconductor die 102, 104. However as will be apparent from the discussion to follow, a much greater number of die may be included in an MCP in accordance with the current techniques and structures. For purposes of ease of explanation of the depicted examples, reference will be made to attachment of individual semiconductor die. However, it should be understood that any of the depicted individual semiconductor die may be replaced by another form of "semiconductor die structure." As used herein, the term "semiconductor die structure" refers to any of: (i) a single semiconductor die; (ii) a single semiconductor die attached to another structure such as an interposer or similar structure; or (iii) multiple semiconductor die stacked with one another (and potentially one or more interposers or similar structures). For example, in one example configuration, MCP 100 could be formed including a semiconductor die structure including a vertical stack of memory die, (that may, in some cases, also be stacked with a logic die and/or an interposer). As result, in the depicted examples discussed herein, any of the identified individual semiconductor die could be replaced with a more complex "semiconductor die structure." To reiterate part of the above description, the term "semiconductor die structure" includes an individual semiconductor die.

Each semiconductor die 102, 104 is respectively coupled to metal base plate 106, with the front sides of each die (having external facing contact structures), indicated generally at 110 and 112, facing away from metal base plate 106. As noted above, this attachment can be by either of an organic adhesive or a metal alloy, which in many examples can be selected with sufficient thermal transfer properties to also act as a thermal interface material ("TIM") between each semiconductor die 102, 104 and metal base plate 106. Because the use of a bonding system with appropriate properties to also serve as a TIM, for ease of description of the example embodiments, the bonding system will be described as a TIM, with the express reservation that other examples may use a bonding system without such thermally conductive properties (for example, where another form of solid plate is used in place of the illustrative metal base plates described herein).

For many MCP devices, the semiconductor die will be thinned from their thickness when manufactured. For example, the wafer thickness during manufacture may be, for many semiconductor die, in the vicinity of 750 µm. However, the thickness of the thinned die that would be incorporated into MCP 100, could be in the vicinity of approximately 100 µm to 200 µm. For examples of MCP 100 for which thermal distribution is a significant, a starting reference for thickness of metal base plate 106, for many example configurations, is that it have a thickness approximately as the attached semiconductor die, or greater. In general, greater thickness for the metal base plate enhances thermal transfer, with a trade-off of increasing height of the MCP. In many examples, metal base plate 106 may be between 200 µm and 1.6 mm, while for other example 1.2 mm.

As noted previously, the TIM material 108a, 108b used to attach each semiconductor die 102, 104 to metal base plate 106 can either be a metallic alloy (in many examples, a metal alloy solder), or an organic adhesive. Generally, a metal TIM will offer better thermal transfer than the organic materials. For many examples, the TIM will have a thermal conductivity of 2 Watts/meter times Kelvin ("W/mK") or greater; and when cured will have an adhesive force of 10 Newtons ("N") or greater. Many organic polymeric TIM ("PTIM") will include a matrix, for example in many examples an epoxy matrix, with a filler to improve thermal conductivity. Such fillers for organic adhesives such as epoxy, can include silica, micro-diamond particles, etc.

In examples utilizing a metal TIM, a variety of metal alloy solders may be utilized, including, by way of example only, Tin-Bismuth (in some examples, tending toward Tn-rich alloys), eutectic Tin-Bismuth, Copper-Tin, any of the preceding further including Indium (In), indium-silicon-copper, and Tin-Silver-Copper (known as "SAC 305"). For example, Tin-Indium has a Tm of about 118° C., Tin-Bismuth has a Tm of about 145° C., and Tin-Copper has a Tm of about 221° C. An alternative to such traditional solder materials would be galinistan—an alloy of Ga—In—Tn which is liquid at room temperature, but reactive to solidify under conditions of increased temperature and pressure. In examples in which galinistan is utilized, additional stopping layers such as nickel under copper may be utilized to restrain contact of the galinistan (and any associated corrosive action of the material) prior to its solidification and bonding of die to the metal base plate.

Whichever material is utilized, the material may be selected to maintain its adhesive properties under conditions that will be experienced in further formation of the reconstituted wafer and the RDL. In many examples, the limiting temperature will be the curing temperature of the mold compound 116. While many different forms of mold compound may be utilized, a mold compound having a curing temperature between 150° C. and 180° C. would be common, and would be desirable. In examples in which such a mold compound is selected, an organic TIM should have a glass transition temperature (Tg) of at least 150° C., and for some examples, in excess of 180° C.; and similarly, a metallic TIM should have a melting temperature (Tm) in excess of at least 150° C., and for some examples of at least 180° C. Some forms of mold compound, however, are used in the industry, which have a curing temperature as low as 120° C. Where such a mold compound is to be used, so long as the TIM remains solid to a point above 120° C. (or other curing temperature of the mold compound being utilized), the TIM should be satisfactory so long as no higher processing temperatures will be imposed upon the structure, subsequent to forming the molded component. In some processes, for example, the temperatures and pressures utilized in laminating build-up layers of the RDL (indicated generally at 122) can establish the gating conditions governing the selection of an appropriate TIM. As will be apparent to persons skilled in the art having the benefit of this disclosure, the greater the subsequent processing temperature, the more limited are the options for a suitable TIM material, as the TIM material needs to maintain its solid bonding functionality during any such subsequent temperatures to which the TIM will be subjected.

In general, the TIM material will have a lower thermal conductivity than that of metal base plate 106. As a result, it may often be desirable to have a TIM 108a, 108b, with a relatively limited vertical dimension which is still sufficient to compensate for any localized non-planarity in either the die or the metal base plate and to fully adhere to the surface of each (for example, compensating for any variations in planarity of either surface). While theoretically, a TIM with a thickness of 1 µm could be considered desirable, a thicker TIM will likely be required for many examples. For many examples, a suitable TIM thickness will end up being at least 3 µm, and likely within the 5 µm to 10 µm range.

Once mold compound 116 is dispensed within the mold carrier (not depicted) and has cured, mold compound will further adhere to and secure metal base plate 106 to MCP 100. The cured mold compound completes formation of the reconstituted wafer, identified generally at 120. The RDL, indicated generally at 122, can then be formed over the reconstituted wafer. In the depicted example, RDL 122 includes three buildup layers, 124, 126, 128, each formed of a suitable dielectric material, as known in the art, each buildup layer supporting a respective metal (or other conductive material) layer M1, M2, M3 which collectively form conductive traces and interconnects (commonly in the form of conductive micro-vias) to collectively redistribute the contacts of the semiconductor die to desired locations, including interconnecting semiconductor die (or semiconductor die structures) in a MCP. In example MCP 100, semiconductor die 102 and 104 are interconnected through RDL 122, as indicated at 130, and also connected to contact pads 132 two mechanically and electrically contact external devices/structures. As will be apparent to persons skilled in the art having the benefit of this disclosure, any of multiple die within a MCP can be coupled to one another or to external devices or structures through the conductive traces and interconnects of RDL 122.

Figure 2A:
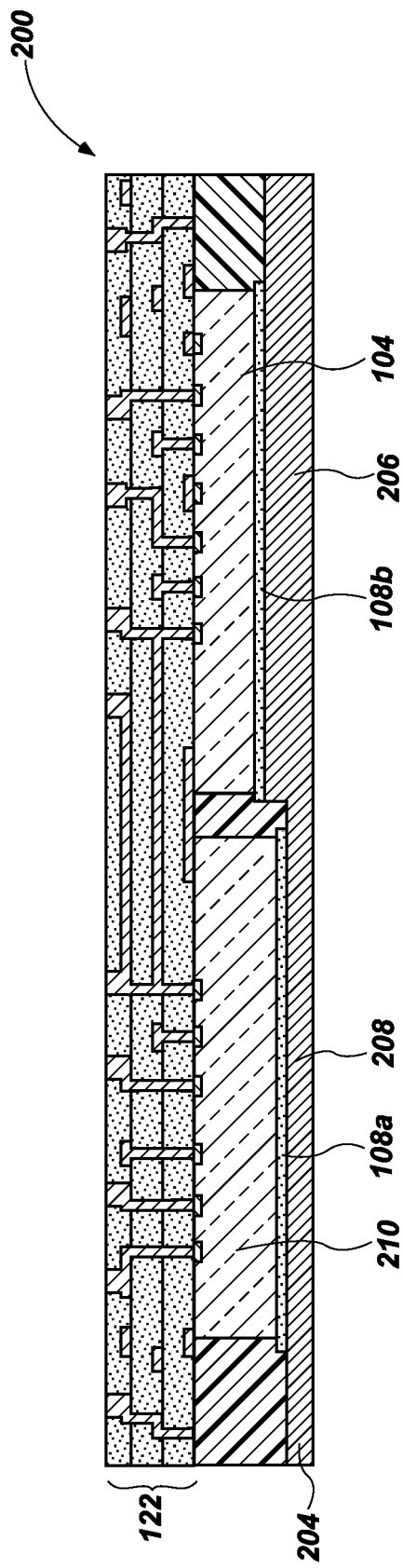
FIGS. 2A-2B each depict simplified cross-sectional representations of alternative example structures for forming respective MCP microelectronic devices.
Figure 2B:
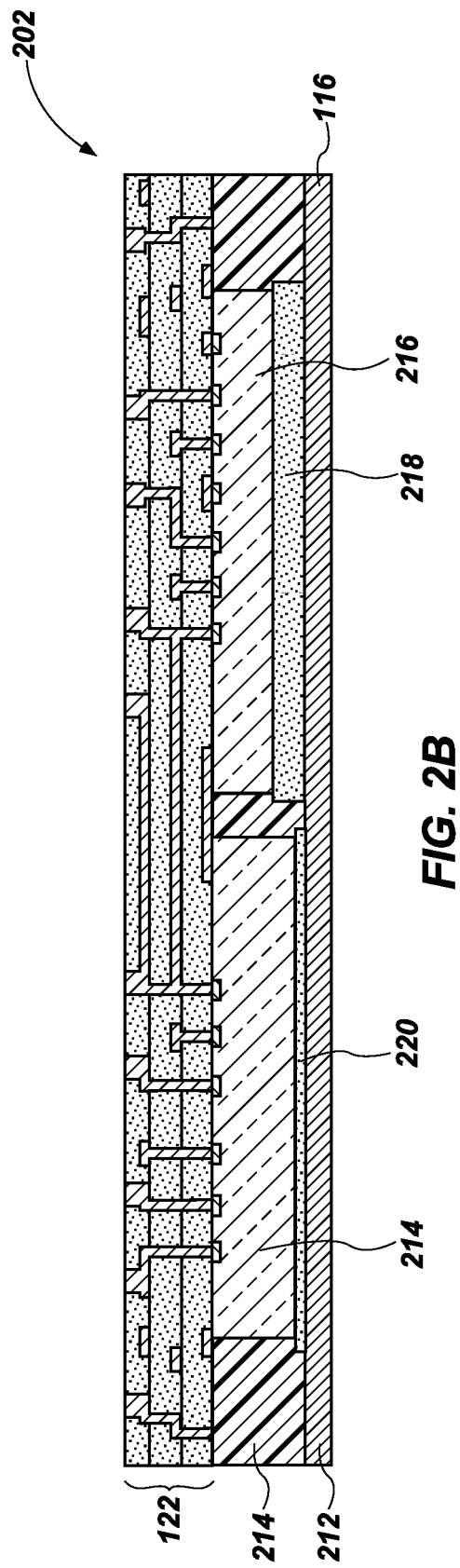

Referring now to FIGS. 2A-2B, the figures depict two alternative configurations for an MCP, 200 and 202, each of which is adapted to facilitate forming of an MCP using semiconductor die (or semiconductor die structures) of different heights. Each of example MCPs 200 and 202 includes structures directly analogous to those in MCP 100, and such analogous structures have been numbered as they were in MCP 100. MCP 200 differs from MCP 100 in having a metal base plate 204 with a non-uniform thickness, as indicated by a region of a first thickness 206 under semiconductor die 104, and a region of a second, reduced thickness 208 under semiconductor die structure 210 (which has a greater height than semiconductor die 104). The reduced thickness of region 208 facilitates the active surfaces of semiconductor die 104 and semiconductor die structure 210 being essentially coplanar with one another.

In FIG. 2B, MCP 202 includes a metal base plate 212 of a uniform thickness. A difference in height between semiconductor die structure 214 and (shorter) semiconductor die 216 is compensated for by an increased thickness of TIM 218 under die 216, relative to TIM 220 under semiconductor die structure 214. Due to a desire to maintain optimal thermal transfer between semiconductor die 216 and metal base plate 212, unless the height difference between TIM 218 and TIM 200 is relatively small, for example under 20 µm. A metallic TIM material may be a better choice for TIM 218 and TIM 200, due to the generally greater thermal transfer properties of metal TIM.

Figure 3:
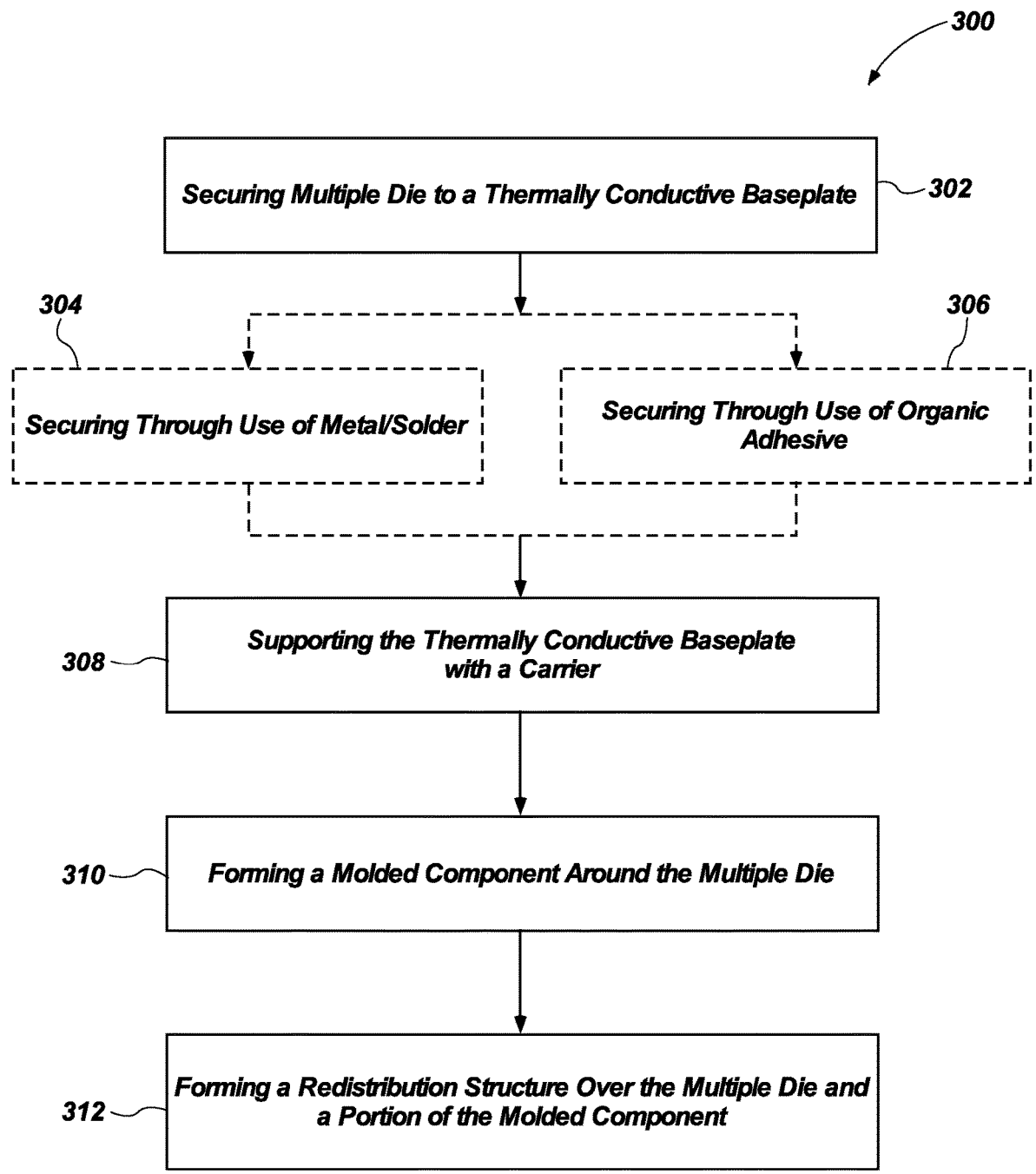
FIG. 3 is a flowchart of an example method for forming a MCP microelectronic device in accordance with the descriptions herein.

Referring now to FIGS. 3 and 4A-4G, FIG. 3 is a flowchart of an example method 300 for forming a MCP with a reconstituted wafer; and FIGS. 4A-4G depict example stages illustrative of the example method of FIG. 3. As indicated at 302, multiple die are secured to a thermally conductive base plate, such as a metal base plate as discussed above in reference to FIGS. 1 and 2A-2B. As indicated at 304, the securing may optionally be done through use of either a metal TIM, such as a metal alloy solder; or as indicated at 306, the securing may optionally be through use of an organic adhesive (PTIM).

Figure 4A:
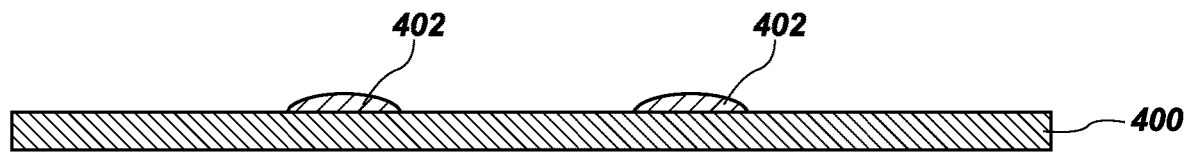
FIGS. 4A-4G each depict a simplified cross-sectional representation of an example representative stage of forming a MCP microelectronic device such as that of FIG. 1, illustrating an example implementation of the method of FIG. 3
Figure 4B:
Figure 4C:
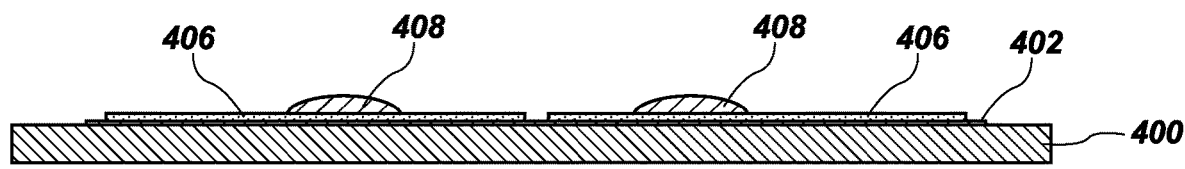
Figure 4D:
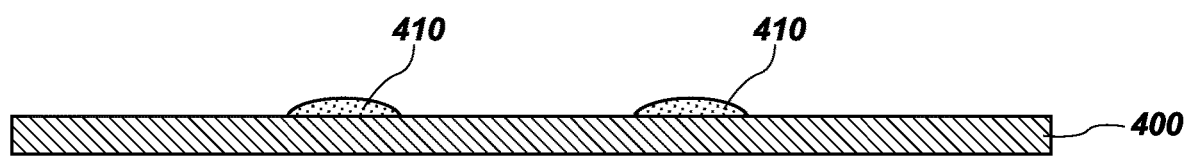

Referring now to FIGS. 4A-C, when a metal solder is to be used, a flux material 402 may commonly be applied to the upper surface of metal base plate 400 in each location where a die is to be attached. Subsequently, a preform 406 of the metal alloy will be placed over flux material 402. In some examples, placement of metal alloy preform 406 can distribute flux material 402, while in other examples flux material 402 will be distributed over the attachment location prior to placement of preform 406. Another volume of flux material 408 will then be placed over metal alloy preform 406. As depicted in FIG. 4D, in the event that an organic TIM will be used (as indicated at 306 in FIG. 3), the organic TIM material 410 may be dispensed in the attachment locations on metal base plate 400.

Figure 4E:
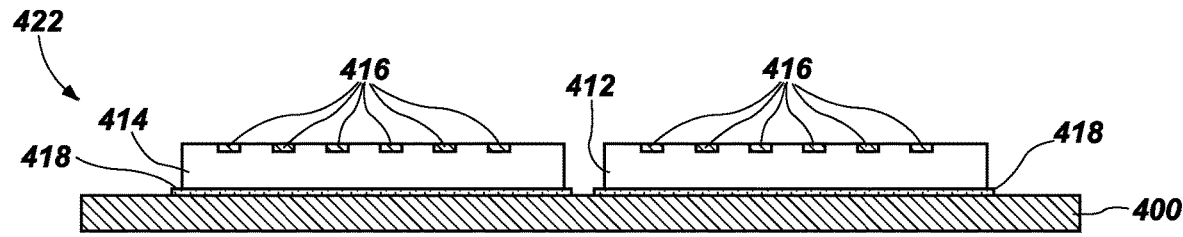

Subsequently, as depicted in FIG. 4E, example semiconductor die 412, 414 will be placed in each location over the deposited TIM material 418 (which may be of either type discussed in reference to FIGS. 4A-4D). The assembly 422 depicted in FIG. 4E will then be subjected to appropriate conditions of temperature and pressure to cause the TIM 418 to secure each die 412, 414 (and any additional semiconductor die structures that may be included in the MCP) to metal base plate 400.

Figure 5:
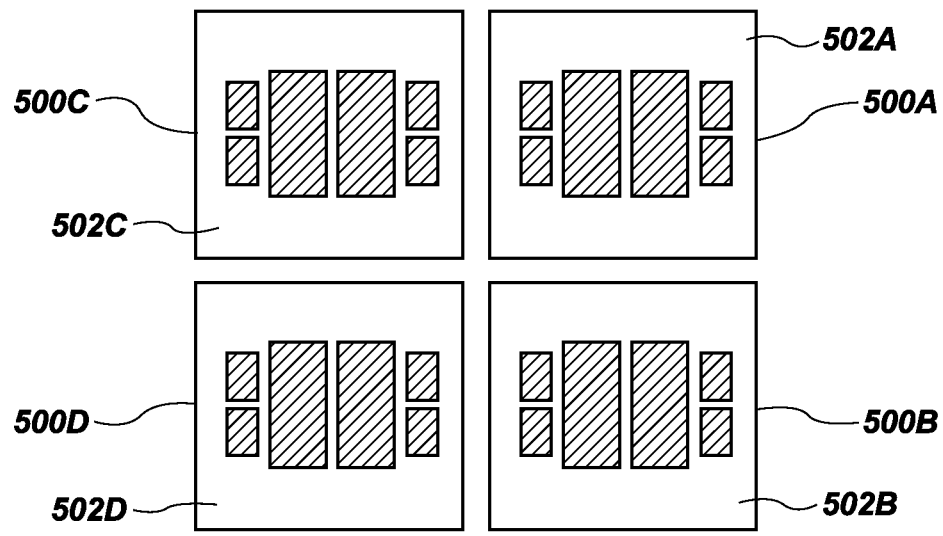
FIG. 5 depicts a plan view of four MCP sites, each with multiple placed die prior to encapsulation with a molding compound.

Referring now to FIG. 5, the figure depicts an example of four individual MCP assemblies 500A, 500B, 500C, 500D after attachment of six semiconductor die of each MCP to a respective base plate 502A, 502B, 502C, 502D for each MCP assembly. As noted previously, each individual MCP assembly may be formed on a common metal base plate, or may be formed on a respective individual base plate, as shown in FIG. 5.

Referring again to the flowchart of FIG. 3, as indicated at 308, the metal base plate will be supported with a carrier. In many examples, the metal base plate(s) whether singular for each MCP, or with components of multiple MCPs sharing a common base plate, will be supported by the carrier before the die are secured to the base plate, as indicated at 302, though such is not necessarily required until preparation for the molding operation.

As indicated at 310, the method next includes forming a molded component around the multiple die. As is apparent from the preceding discussion, the molded component can securely retain the multiple die in fixed relation to one another and can further attach the metal base plate to the other components of the MCP. The molding material can be distributed over the semiconductor die and within the carrier in a manner well known to persons skilled in the art, and subjected to appropriate conditions of temperature and pressure to form an essentially void-free solid encapsulant for the MCP assembly. The attachment of each die to the metal base plate through the organic or metal alloy bonding system is selected to withstand the forces placed on the die that would cause movement of one or more die of a MCP assembly during the distribution of the mold compound and the conditions of temperature and pressure to which the die are subjected during formation of the molded component.

Figure 4F:
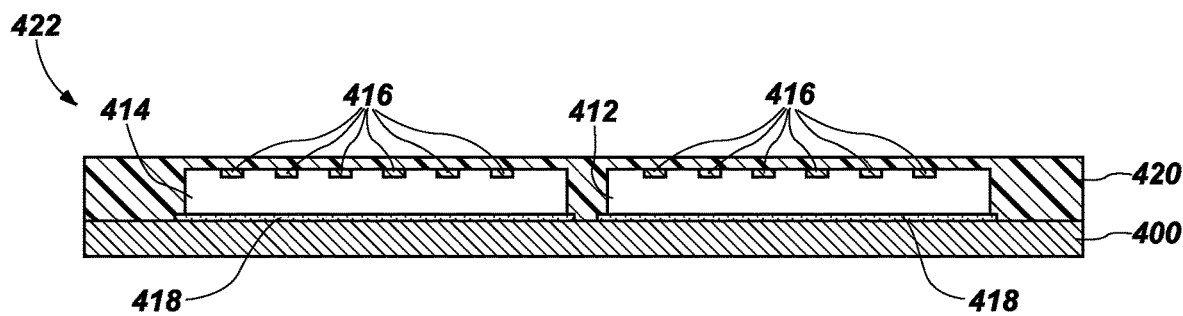
Figure 4G:
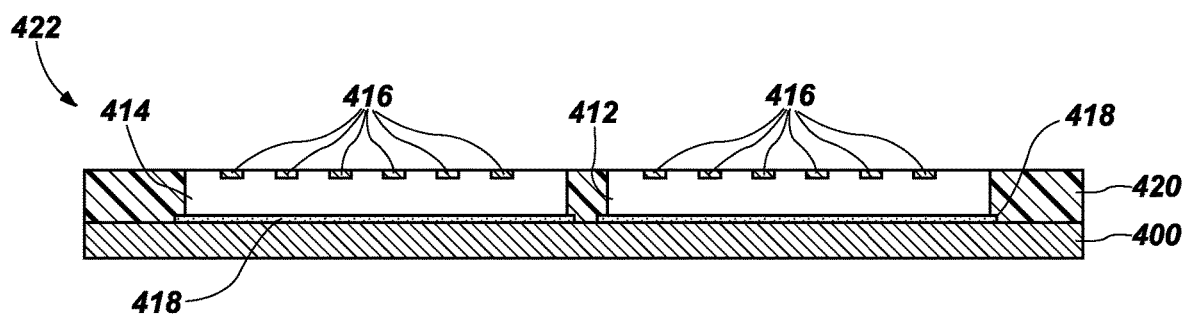

Referring now to FIGS. 4F-4G, FIG. 4F shows the MCP assembly 422 of FIG. 4E with the molded component 420 in place around the semiconductor die. FIG. 4G shows the MCP assembly 422 of FIG. 4F after removal of the molding material overlaying the multiple semiconductor die, to expose the contact structures 416 of the example semiconductor die 412, 414 that will be used to form the first level interconnect of the semiconductor die to an RDL layer. Such contact structures can be contact pads, die bumps, metal pillars, or other contact structures known to persons skilled in the art. In some examples, the contact structures on one or more semiconductor die in an MCP assembly may be used to compensate for relatively small, for example, 10 μm or less variations in height between semiconductor die in a MCP.

Figure 6:
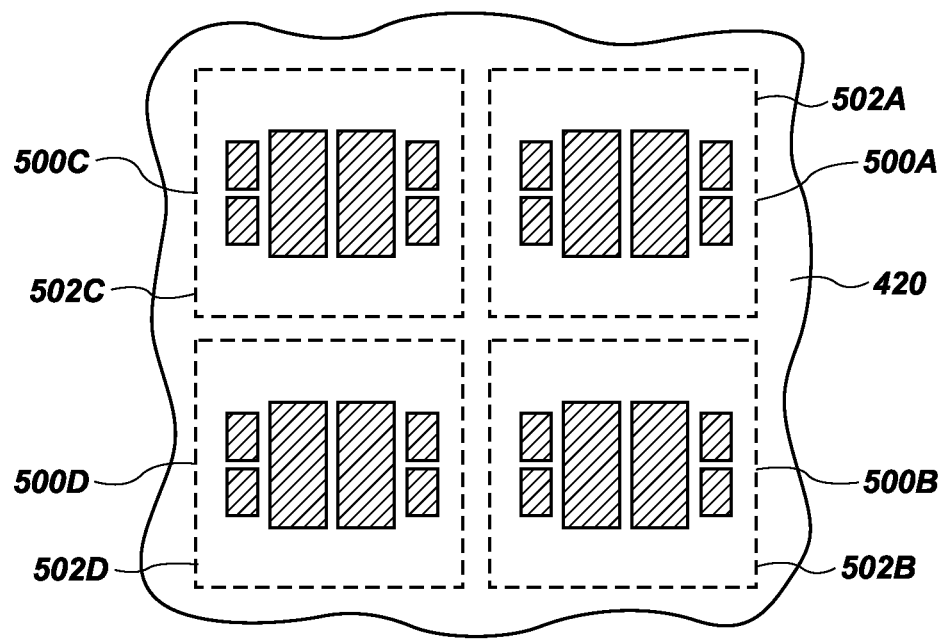
FIG. 6 depicts a portion of a reconstituted wafer including the four MCP sites of FIG. 5.

Referring now to FIG. 6, that figure depicts the four individual MCP assemblies of FIG. 5 after forming of the molded component 420 over the four individual MCP assemblies 500A, 500B, 500C, 500D, and exposure of the contact structures as discussed relative to FIG. 4G.

Referring once again to FIG. 3, as indicated 312, a redistribution layer, having one or more layers, as desired, will be formed over the multiple die and the molded component (i.e. over the reconstituted wafer). In many examples, multiple MCP sites will be processed together (as depicted in FIGS. 5 and 6), and the individual sites will be singulated to form individual MCPs. As noted previously, in examples in which multiple MCP sites are formed on a single metal base plate structure, the singulation will include separating the base plate along as well as the molded component to form the individual MCPs.

Figure 7:
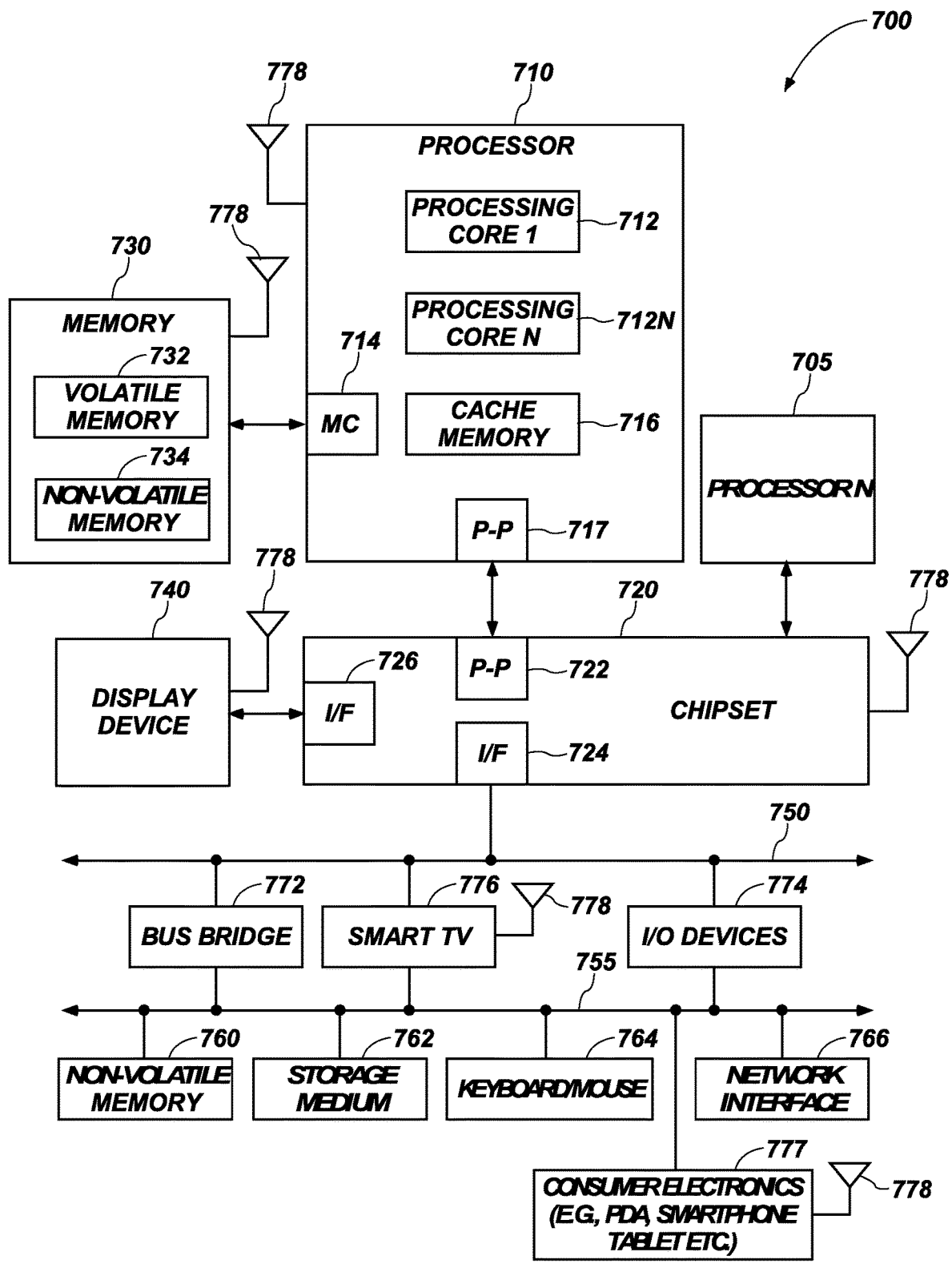
FIG. 7 depicts a system level diagram of an electronic system which may incorporate an embedded die microelectronic device such as any of the microelectronic devices as described herein.

FIG. 7 illustrates a system level diagram, according to one embodiment of the invention. For instance, FIG. 7 depicts an example of an electronic device (e.g., system) including one or more microelectronic devices including multiple die mechanically and thermally coupled to a common metal base plate configured to serve as a heat spreader, as described herein. FIG. 7 is included to show an example of a higher level device application for the present invention. In one embodiment, system 700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 700 is a system on a chip (SOC) system.

In one embodiment, processor 710 has one or more processing cores 712 and 712N, where 712N represents the Nth processor core inside processor 710 where N is a positive integer. In one embodiment, system 700 includes multiple processors including 710 and 705, where processor 705 has logic similar or identical to the logic of processor 710. In some embodiments, processing core 712 includes, but is not limited to, pre-fetch logic to fetch instructions, decode logic to decode the instructions, execution logic to execute instructions and the like. In some embodiments, processor 710 has a cache memory 716 to cache instructions and/or data for system 700. Cache memory 716 may be organized into a hierarchal structure including one or more levels of cache memory.

In some embodiments, processor 710 includes a memory controller 714, which is operable to perform functions that enable the processor 710 to access and communicate with memory 730 that includes a volatile memory 732 and/or a non-volatile memory 734. In some embodiments, processor 710 is coupled with memory 730 and chipset 720. Processor 710 may also be coupled to a wireless antenna 778 to communicate with any device configured to transmit and/or receive wireless signals. In one embodiment, the wireless antenna interface 778 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 734 includes, but is not limited to, flash memory, phase change memory (PCM), read-only memory (ROM), electrically erasable programmable read-only memory (EEPROM), or any other type of non-volatile memory device.

Memory 730 stores information and instructions to be executed by processor 710. In one embodiment, memory 730 may also store temporary variables or other intermediate information while processor 710 is executing instructions. In the illustrated embodiment, chipset 720 connects with processor 710 via Point-to-Point (PtP or P-P) interfaces 717 and 722. Chipset 720 enables processor 710 to connect to other elements in system 700. In some embodiments of the invention, interfaces 717 and 722 operate in accordance with a PtP communication protocol such as the Intel® QuickPath Interconnect (QPI) or the like. In other embodiments, a different interconnect may be used.

In some embodiments, chipset 720 is operable to communicate with processor 710, 705N, display device 740, and other devices 772, 776, 774, 760, 762, 764, 766, 777, etc. Chipset 720 may also be coupled to a wireless antenna 778 to communicate with any device configured to transmit and/or receive wireless signals.

Chipset 720 connects to display device 740 via interface 726. Display 740 may be, for example, a liquid crystal display (LCD), a plasma display, cathode ray tube (CRT) display, or any other form of visual display device. In some embodiments of the invention, processor 710 and chipset 720 are merged into a single SOC. In addition, chipset 720 connects to one or more buses 750 and 755 that interconnect various elements 774, 760, 762, 764, and 766. Buses 750 and 755 may be interconnected together via a bus bridge 772. In one embodiment, chipset 720 couples with a non-volatile memory 760, a mass storage device(s) 762, a keyboard/mouse 764, a network interface 766, a smart TV 776, consumer electronic(s) 777, etc. via interface 724.

In one embodiment, mass storage device 762 includes, but is not limited to, a solid state drive, a hard disk drive, a universal serial bus flash memory drive, or any other form of computer data storage medium. In one embodiment, network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into processor core 712.

To better illustrate the methods and apparatuses described herein, a non-limiting set of Example embodiments are set forth below as numerically identified Examples.

Example 1 is a microelectronic device, comprising: a thermally conductive base plate; multiple semiconductor die structures extending beside one another and mechanically and thermally coupled to the thermally conductive base plate by a thermal interface material, wherein the active surfaces of the semiconductor die structures face away from the thermally conductive base plate; a molded component surrounding the multiple semiconductor die structures and contacting the thermally conductive base plate; and a redistribution layer formed on the multiple semiconductor die and the molded component.

In Example 2, the subject matter of Example 1 wherein the first semiconductor die structure of the multiple semiconductor die structures comprises a stack of semiconductor die.

In Example 3, the subject matter of any one or more of Examples 1-2 wherein each of the first and second semiconductor die structures is a single semiconductor die.

In Example 4, the subject matter of any one or more of Examples 1-3 wherein the thermal interface material comprises a metal alloy.

In Example 5, the subject matter of any one or more of Examples 1-4 wherein the thermal interface material comprises an organic adhesive.

In Example 6, the subject matter of any one or more of Examples 1-5 wherein the multiple semiconductor die structures have different heights.

In Example 7, the subject matter of Example 6 wherein the thermally conductive base plate has a non-uniform thickness, and includes a region of a reduced thickness to accommodate a first semiconductor die structure having a greater height than a second semiconductor die structure.

In Example 8, the subject matter of any one or more of Examples 1-7 wherein the thermally conductive base plate is formed of metal.

Example 9 is a method of forming a microelectronic device, comprising: bonding multiple semiconductor die structures to a metal base plate, wherein the active side of the semiconductor die structures faces away from the metal base plate, and wherein the multiple semiconductor die structures are bonded to the metal base plate through use of a thermal interface material with an adhesive strength of 10 Newtons or greater; forming a molded component surrounding the multiple semiconductor die structures and contacting the metal base plate; and forming a redistribution layer formed on the multiple semiconductor die and the molded component.

In Example 10, the subject matter of Example 9 wherein the multiple semiconductor die structures coupled to the metal base plate are all part of a single multi-chip package to be formed.

In Example 11, the subject matter of any one or more of Examples 9-10 wherein the multiple semiconductor die structures are coupled to and distributed on the metal base plate to form multiple multi-chip packages.

In Example 12, the subject matter of Example 11 optionally includes singulating the molded component, the metal base plate, and the RDL buildup layers to define multiple multichip packages.

In Example 13, the subject matter of any one or more of Examples 9-12 wherein a first semiconductor die structure of the multiple semiconductor die structures comprises a stack of semiconductor die.

In Example 14, the subject matter of Example 13 wherein a second semiconductor die structure of the multiple semiconductor die structures is a single semiconductor die.

In Example 15, the subject matter of any one or more of Examples 9-14 wherein the molded component is formed of a mold compound having a curing temperature, and wherein the thermal interface material comprises a metal alloy having a melting temperature higher than the curing temperature.

In Example 16, the subject matter of any one or more of Examples 9-15 wherein the molded component is formed of a mold compound having a curing temperature, and wherein the thermal interface material comprises an organic adhesive having a glass transition temperature higher than the curing temperature.

In Example 17, the subject matter of any one or more of Examples 9-16 wherein the metal base plate is defined by two parallel planar surfaces.

In Example 18, the subject matter of any one or more of Examples 9-17 wherein the metal base plate has a non-uniform vertical thickness.

In Example 19, the subject matter of any one or more of Examples 9-18 wherein the thermal interface material is formed with a first vertical thickness under a first semiconductor die structure, and is formed with a second vertical thickness under a second semiconductor die structure, wherein the first semiconductor die structure has a greater height than the second semiconductor die structure, and wherein the second vertical thickness is greater than the first vertical thickness.

Example 20 is an electronic system comprising: a multi-chip package, comprising, a metal base plate; multiple semiconductor die structures extending beside one another and mechanically and thermally coupled to the metal base plate by a thermal interface material, wherein the active surfaces of the semiconductor die structures face away from the metal base plate; a molded component surrounding the multiple semiconductor die structures and contacting the metal base plate; and a redistribution layer formed on the multiple semiconductor die and the molded component; wherein a first semiconductor die structure of the multiple semiconductor die structures comprises a processor; and at least one of an additional semiconductor device, a mass storage device and a network interface operably coupled to the multi-chip package.

Example 21 includes the subject matter of Example 20, wherein the first semiconductor die structure of the multiple semiconductor die structures comprises a stack of semiconductor die.

Example 22 includes the subject matter of any of Examples 1-8, manufactured in accordance with any of the methods of Examples 9-19.

Example 23 includes the subject matter of any of Examples 20-21, which include a microelectronic device in accordance with any of Examples 1-8.

Example 24 includes the subject matter of any of Examples 20-21 which include a microelectronic device manufactured in accordance with any of the methods of Examples 9-19.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "where." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A microelectronic device, comprising:
   a thermally conductive base plate, the base plate consisting essentially of two regions, of which a first region has a first thickness, and a second region has a second thickness less than the first thickness;
   multiple semiconductor die structures coupled to the thermally conductive base plate, including,
      a first semiconductor die structure mechanically and thermally coupled to the thermally conductive base plate in the first region by thermal interface material, and
      a second semiconductor die structure mechanically and thermally coupled to the thermally conductive base plate in the second region by thermal interface material,
      wherein the multiple semiconductor die structures include active surfaces, and wherein the active surfaces of the multiple semiconductor die structures face away from the thermally conductive base plate;
   a molded component surrounding the multiple semiconductor die structures and contacting the thermally conductive base plate; and
   a redistribution layer formed on the multiple semiconductor die structures and the molded component.

2. The microelectronic device of claim 1, wherein the second semiconductor die structure of the multiple semiconductor die structures comprises a stack of semiconductor die.

3. The microelectronic device of claim 1, wherein each of the first and second semiconductor die structures is a single semiconductor die.

4. The microelectronic device of claim 1, wherein the thermal interface material comprises a metal alloy.

5. The microelectronic device of claim 1, wherein the thermal interface material comprises an organic adhesive.

6. The microelectronic device of claim 1, wherein the first and second semiconductor die structures have different heights.

7. The microelectronic device of claim 6, wherein the second semiconductor die structure has a greater height than that of the first semiconductor die structure.

8. The microelectronic device of claim 1, wherein:
   the redistribution layer comprises multiple dielectric layers, each containing vias and supporting respective conductive traces;
   a first dielectric layer of the redistribution layer is formed in part on the molded component; and
   the redistribution layer electrically interconnects the first semiconductor die structure with the second semiconductor die structure.

9. The microelectronic device of claim 1, wherein the thermally conductive base plate comprises metal.

10. The microelectronic device of claim 1, wherein the thermally conductive base plate is formed of metal.

11. The microelectronic device of claim 1, wherein the thermally conductive base plate is formed of a material having a thermal conductivity of at least 100 W/meter times Kelvin (W/mK).

12. A semiconductor device package, comprising:
a metal base plate having a first, maximum, thickness in a first region; and having a second, minimum, thickness in a second region;
multiple semiconductor die structures coupled to the metal base through use of thermal interface material, wherein the semiconductor die structures each have an active side, wherein active sides of the multiple semiconductor die structures face away from the metal base plate, the multiple semiconductor die structures including,
  a first semiconductor die structure coupled to the first region of the metal base plate having the first thickness, and
  a second semiconductor die structure coupled to the second region of the metal base plate having the second thickness;
wherein no portion of the metal base plate has a thickness greater than the first thickness of the first region underlying the first semiconductor die structure;
a molded component surrounding the multiple semiconductor die structures and contacting the metal base plate; and
a redistribution layer formed on the multiple semiconductor die and the molded component.

13. The semiconductor device package of claim 12, wherein at least one semiconductor die structure of the multiple semiconductor die structures comprises a stack of semiconductor die.

14. The semiconductor device package of claim 13, wherein at least one semiconductor die structure of the multiple semiconductor die structures is a single semiconductor die.

15. The semiconductor device package of claim 12, wherein the thermal interface material comprises a metal alloy.

16. The semiconductor device package of claim 12, wherein the thermal interface material comprises an organic adhesive.

17. An electronic system comprising:
a multi-chip package, comprising,
  a thermally conductive base plate, the base plate consisting essentially of two regions, of which a first region has a first thickness, and a second region has a second thickness less than the first thickness;
  multiple semiconductor die structures coupled to the thermally conductive base plate, including,
    a first semiconductor die structure mechanically and thermally coupled to the thermally conductive base plate in the first region by thermal interface material, and
    a second semiconductor die structure mechanically and thermally coupled to the thermally conductive base plate in the second region by thermal interface material;
  wherein the multiple semiconductor die structures include respective active surfaces, and wherein the active surfaces of the semiconductor die structures face away from the thermally conductive base plate; and
  wherein at least one semiconductor die structure of the multiple semiconductor die structures comprises a processor;
  a molded component surrounding the multiple semiconductor die structures and contacting the thermally conductive base plate;
  a redistribution layer formed on the multiple semiconductor die structures and the molded component, the redistribution layer comprising multiple dielectric layers each containing vias and supporting respective conductive traces, wherein a first dielectric layer of the redistribution layer is formed at least in part on the molded component; and
at least one additional component external to the multi-chip package and which is operably coupled to the multi-chip package, the additional component selected from a group consisting essentially of: an additional semiconductor die structure, a mass storage device, and a network interface.

18. The electronic system of claim 17, wherein at least one semiconductor die structure of the multiple semiconductor die structures comprises a stack of semiconductor die.

19. The electronic system of claim 17, wherein the thermal interface material comprises a metal alloy.

20. The electronic system of claim 17, wherein the thermal interface material comprises an organic adhesive.

* * * * *